US012602365B2

(12) United States Patent
Blasco

(10) Patent No.: US 12,602,365 B2
(45) Date of Patent: Apr. 14, 2026

(54) METHOD FOR TRANSMITTING A BLOOM FILTER FROM A TRANSMITTER UNIT TO A RECEIVER UNIT

(71) Applicant: Deutsches Zentrum für Luft-und Raumfahrt e.V., Bonn (DE)

(72) Inventor: Francisco Lázaro Blasco, Wessling (DE)

(73) Assignee: Deutsches Zentrum für Luft- und Raumfahrt e.V., Bonn (DE)

( * ) Notice: Subject to any disclaimer, the term of this patent is extended or adjusted under 35 U.S.C. 154(b) by 9 days.

(21) Appl. No.: 18/411,634

(22) Filed: Jan. 12, 2024

(65) Prior Publication Data

US 2024/0264995 A1 Aug. 8, 2024

(30) Foreign Application Priority Data

Feb. 2, 2023 (DE) ...................... 10 2023 102 530.9

(51) Int. Cl.
G06F 16/22 (2019.01)
H03M 13/11 (2006.01)
(52) U.S. Cl.
CPC ..... G06F 16/2255 (2019.01); H03M 13/1154 (2013.01)
(58) Field of Classification Search
None
See application file for complete search history.

(56) References Cited

U.S. PATENT DOCUMENTS

| | | | | |
|---|---|---|---|---|
| 8,230,217 B2 * | 7/2012 | He | .................... | H04L 9/3236 |
| | | | | 713/168 |
| 8,428,379 B2 * | 4/2013 | Rane | .................. | H04N 19/395 |
| | | | | 382/250 |
| 9,600,524 B2 * | 3/2017 | He | .................... | G06F 16/438 |
| 2013/0266078 A1 * | 10/2013 | Deligiannis | .......... | H04N 19/152 |
| | | | | 375/240.25 |
| 2013/0275544 A1 * | 10/2013 | Westphal | .............. | G06F 15/167 |
| | | | | 709/213 |
| 2023/0107962 A1 * | 4/2023 | Benson | ............... | H04L 63/0823 |
| | | | | 713/171 |
| 2023/0155608 A1 * | 5/2023 | Yoskovits | .............. | G11C 29/52 |
| | | | | 714/758 |

OTHER PUBLICATIONS

Pradhan et al., "Distributed Source Coding Using Syndromes (DIS-CUS): Design and Construction," In Data Compression Conference, pp. 158-167. IEEE Computer Society, 1999. (Year: 1999).*

(Continued)

*Primary Examiner* — Richard L Bowen
(74) *Attorney, Agent, or Firm* — The Webb Law Firm

(57) ABSTRACT

The invention relates to a method for transmitting a Bloom filter from a transmitter unit to a receiver unit. The method includes the following steps of providing a Bloom filter by the transmitter unit; compressing the Bloom filter by the transmitter unit, the compression of the Bloom filter being performed based on a Slepian-Wolf encoding method; and transmitting the Bloom filter compressed using the Slepian-Wolf encoding method from the transmitter unit to the receiver unit.

13 Claims, 8 Drawing Sheets

(56)                    References Cited

OTHER PUBLICATIONS

B. H. Bloom, "Space/time trade-offs in hash coding with allowable errors," Commun. ACM, vol. 13, pp. 422-426, Jul. 1970 (Year: 1970).*

Li, Jing, Zhenyu Tu, and Rick S. Blum. "Slepian-Wolf coding for nonuniform sources using turbo codes." In Data Compression Conference, 2004. Proceedings. DCC 2004, pp. 312-321. IEEE, 2004. (Year: 2004).*

Liu, Ling, et al., "Set Reconciliation for Blockchains with Slepian-Wolf Coding: Deletion Polar Codes", 2021 13th International Conference on Wireless Communications and Signal Processing (WCSP), Changsha, China, 2021, pp. 1-5.

* cited by examiner

100

110 — Providing a Bloom filter by the transmitter unit

120 — Compressing the Bloom filter at the transmitter by Slepian-Wolf encoding

130 — Transmitting by the receiver unit, the Bloom filter

METHOD FOR TRANSMITTING A BLOOM FILTER FROM A TRANSMITTER UNIT TO A RECEIVER UNIT

CROSS REFERENCE TO RELATED APPLICATION

This application claims priority to German Patent Application No. 10 2023 102 530.9, filed Feb. 2, 2023, the disclosure of which is hereby incorporated by reference in its entirety.

BACKGROUND OF THE INVENTION

Field of the Invention

The present invention relates to a method for transmitting a bloom filter from a transmitter unit to a receiver unit, as well as to a corresponding method for reconstructing a bloom filter by a receiver unit. Moreover, the present invention relates to a corresponding transmitter unit and a corresponding receiver unit which is configured to execute the above-mentioned methods.

A Bloom filter is a probabilistic data structure which may be used for a compact representation of a data set and at the same time allows for membership queries. In practice, Bloom filters (often also referred to as Bloom filter data structures) are used in a variety of applications. In the context of the present invention, particular consideration is given to applications in which Bloom filters are transmitted as a message via a data network. Here, particular attention should be given to the case in which the two parties involved, i.e. the transmitter unit and the receiver unit, include two Bloom filters which are similar but not necessarily identical. In particular, the present invention proposes a method which allows messages transmitted by the Bloom filters to be compressed by resorting to Slepian-Wolf encoding methods which are also known as distributed source encoding. The applicability of the invention is not restricted to (standard) Bloom filters, but applies to all Bloom filter variants, such as counting Bloom filters, d-left-counting Bloom filters, deletable Bloom filters, hierarchic Bloom filters, spectral Bloom filters, Bloomier Bloom filters, stable Bloom filters, invertible Bloom lookup tables (IBLT), etc.

Description of Related Art

A Bloom filter [1] is a probabilistic data structure which enables a compact representation of a data set and allows for fast membership queries. The membership queries never result in a false negative, but may, with a certain probability, result in a false positive.

Hereinafter, a quantity $S=\{s_1, s_2, \ldots, s_n\}$ with n elements is assumed. A Bloom filter represents S as an array of m bits which is based on k independent hash functions, $h_1$, $h_2, \ldots, h_k$, the output of which is in the range of $\{0, 1, \ldots, m-1\}$. To represent S with a Bloom filter, the procedure is as follows. First, the array of m bits is initialized with the value zero. Then, the bits at the positions $h_i(s)$, $i=1, 2, \ldots, k$, are set to one for each element $s \in S$. To check whether a particular element x belongs to S, it must be checked whether all Bits $h_i(x)$, $i=1, 2, \ldots, k$, are set to one. If this is the case, the query returns true, which means that x (probably) is in S. If, however, not all $h_i(x)$ are set to one, the query returns false, which means that x is (certainly) not in S.

If the false-positive probability in dependence on m, the length of the Bloom filter, is to be minimized, it is generally known that the number of the hash functions k has to be chosen as (a natural number near) $k \cong \log(2)$ m/n which results in a false-positive probability $P_{fa} \cong 2^{-k} \cong 0.6185^{m/n}$.

In many applications, however, the bloom filter has to be transmitted as a message via a data network. In this case, it is possible to compress the Bloom filter before it is transmitted via the network, to be subsequently decompressed and recover the Bloom filter on the receiver side. This is relevant for applications in which not the length of the Bloom filter is decisive, but the length of the message transmitted by the Bloom filter, i.e. the required bandwidth. It has been shown in [2] that, when $k \cong \log(2)$ m/n is selected, the resultant Bloom filter can hardly be compressed, since, at the end, the resultant Bloom filter is a character string of m bits in which each bit assumes the value 0 or 1 with a probability of 1/2, i.e. it looks like an entirely random character string. The papers forming the basis of the present invention showed that it is possible to obtain a lower false-positive probability by starting with a larger Bloom filter, the length of which is referred to as m', where m'>m. At the same time, the number of the hash functions is selected such that the bits in the Bloom filter are no longer regularly distributed, which, for example, leads to a higher probability for 0 than for 1. The Bloom filter with the length of m' bits thus obtained can now be efficiently compressed to z<m bits, with the same false-alarm probability being retained. As an alternative, it is also possible to select $z \cong n$ and obtain a lower (better) false-alarm probability. It is a possible disadvantage of the compressed Bloom filters according to [2] that the Bloom filter requires more storage space after decompression, since m'>m. However, this is no problem in many applications, since nowadays most devices have sufficient memory capacity. In addition, it should be considered that compression and decompression require a certain processing, which again is generally no problem, since the processing is not overly complex.

The same paper [2] also shows how to use the so-called delta compression to update a new filter. In some applications, such as Web Cache Sharing, a transmitter unit (in this case a proxy server) regularly sends Bloom filters to the receiver unit (another proxy server). In such an application, it is not necessary to always send the entire Bloom filter. Instead, it is sufficient to inform the receiver units about which bits have changed. In practice, the changes between successive Bloom filters are small. For example, only 5% of the bits change between successive updates. In this case, arithmetic encoding can be used to achieve a large compression gain. In other words, the messages transmitted by the Bloom filters are much smaller than the Bloom filters themselves.

After all, [2] only considers standard Bloom filters in detail, but the author of this paper states that the compression can also be applied to counting Bloom filters and other variants of Bloom filters.

Counting Bloom filters were introduced in [3] as an extension of Bloom filters, with an array of m counters is being used instead of an array of m bits and each counter is represented by some bits. If an element s is inserted into the counting Bloom filter, the value of the counter $h_i(s)$, for $i=1, 2, \ldots, k$ (for all k hash functions) is increased by one. The main advantage of counting Bloom filters is that, in contrast to standard Bloom filters, they allow the deletion of elements from the filter. For deleting an element s, the value of the counter $h_i(s)$, for $i=1, 2, \ldots, k$ (for all k hash functions) is simply decreased by one.

Besides the counting Bloom filters, there are several other variants of Bloom filters. [4] provides an overview of the different variants. Generally, all Bloom filter variants are probabilistic data structures that rely on a series of hash functions to (approximately) represent a data set. In general, these data structures include one or a plurality of cell arrays. In a standard Bloom filter, for example, a cell corresponds to a bit and in a counting Bloom filter, it corresponds to a counter which is represented by several bits. Other Bloom filter variants have a richer cell structure. In an IBLT [5], for example, a cell consists of a counter which includes the number of entries associated to the cell (like in a counting Bloom filter), and of two further fields conventionally referred to as "keySum" and "valueSum".

Examples for Applications in which Bloom Filters (Including Variants Thereof) are Sent as Messages Bloom filters are sometimes used for the (approximate) reconciliation of data sets. In this application, two hosts A and B are each in possession of a quantity or a set of elements designated as $S_A$ and $S_B$, respectively. The objective is that both parties reconcile their data sets, i.e. obtain a merging of the data sets $S_A \cup S_B$. For reconciling their data sets by means of Bloom filters, host A creates a Bloom filter $BF_A$ representing its data set $S_A$, and host B creates another Bloom filter $BF_B$ representing its data set $S_B$. Next, host A sends $BF_A$ to host B and host B sends $BF_B$ to A. As soon as the former has received $BF_B$, host A performs a membership query for all elements of its data set $S_A$. All elements providing a negative result are not included in $S_B$, which is why host A sends all these elements to host B. Host B performs the same process. This approach only leads to an approximative data reconciliation, since Bloom filters yield false-positive results with a probability different from zero. This means that elements in SA yield one positive result, although they are not included in SB, and are therefore not sent to host B by host A. A scheme for data reconciliation, based on the exchange of Bloom filters, is proposed in [6], while a similar approach that requires several rounds of communication is proposed in [7]. Other approaches for a (approximative) data set reconciliation are based on the exchange of Bloom filter variants. For example, [8] proposes a method using counting Bloom filters, while [9] presents a method based on IBLTs.

Another application based on the exchange of Bloom filters is Web Cache Sharing, where a plurality of proxies have a cache memory in which they store URLs. When a user wants to access a URL, his request is directed to the closest proxy. If the proxy comprises the requested URL, it is sent to the user. Otherwise, the proxy checks, whether the URL is present in another of the proxies. This is done using Bloom filters. In particular, each proxy may comprise a local Bloom filter, in which it represents the URLs in its cache. Moreover, the proxies regularly send their Bloom filters to all other proxies to inform them about changes in their local cache. Due to this efficient solution, each proxy knows what other proxies have stored in their cache.

Another application, in which Bloom filters are sent as messages, is the recognition of malicious URLs (also known as Safe Browsing). In this application, a server keeps a database with known malicious URLs. To represent this database, a Bloom filter is created which is distributed as a part of the web browser. Whenever the user attempts access to a URL, the Browser uses the Bloom filter to check, whether it is malicious or not, and blocks access to the URL, if it is malicious. Since new malicious websites are constantly discovered, the server constantly updates its data base with malicious URLs. To keep users current, the browsers regularly download updated Bloom filters from the server, e.g. four times a day. These updated Bloom filters can be sent either uncompressed or with delta compression. Several variants of this scheme have been proposed, e.g. [10] examines the use of d-left counting Bloom filters (a variant of the counting Bloom filter) and so-called multi-stage Bloom filters for recognizing malicious URLs.

Slepian-Wolf or Distributed Source Encoding

Distributed source encoding describes a general system in information theory, which deals with the compression of a plurality of correlated information sources. In the present invention, particular consideration is given to a structure with two correlated binary information sequences $x_1$, $x_2$, ... and $y_1$, $y_2$, ..., each sequence being connected to realizations of two random variables X and Y. For the sake of simplicity, it is assumed that both random variables X and Y take values in the binary alphabet {0, 1}, although the present invention also includes embodiments with non-binary sources. The dependence between X and Y is characterized by the conditional probability distribution $P_{X|Y}$ (x|y).

In this case, there are two communicating units, the encoder and the decoder. The encoder can only monitor X, while the decoder can only monitor Y. The objective is that the encoder transmits a series of n realizations of X, $x=(x_1, x_2, \ldots, x_n)$ to the decoder and, in doing so, transmits as little information (measured in bits) as possible. The core of the problem is that the encoder has to compress x without having access to $y=(y_1, y_2, \ldots, y_n)$, and the decoder has to decompress without having access to x as illustrated in FIG. 1.

It has been shown in [11] that a loss-free (or perfect) compression is possible at rates of R≥H(X|Y), where H(X|Y) refers to the conditional entropy of X with Y given, i.e. the entropy of the conditional distribution of the random variable X in the random variable Y, X|Y. In general, this limit can be approximated, if n (the sequence length) increases to infinity, whereas in case of a small n, the compression obtained generally decreases.

In practice, the distributed source encoding can be realized using error correction codes (or channel codes). Actually, a large number of distributed source encoding methods has been proposed, which are based on different channel codes.

A common choice is the so-called "syndrome approach" which is generally based on Low Density Parity Check Codes (LDPC) (see [12]). In this approach, an (n, k) channel C with a parity check matrix H is used. The encoder compresses x by calculating the syndrome $s=H x^T$, where $(.)^T$ is the transposition. The syndrome s having the length n−k is sent to a decoder. The decoder then uses a syndrome-based decoding method. In particular, the decoder may first calculate $s'=H y^T$. It then calculates:

$$s'' = s + s' = Hx^T + Hy^T = H(x^T + y^T) = He^T$$

The decoder then tries to determine the "best possible" error vector e that is subject to the condition $He^T=s''$. For example, the decoder can try to calculate the most probable error vector e which results in a syndrome s"

$$\hat{e} = \mathrm{argmax}_e P(e \,|\, s'')$$

Finding the exact solution to this problem is generally a difficult task. Instead, the decoder can try to calculate the following:

$$\tilde{e} = \bigcup_{i=1}^{n} \operatorname{argmax}_i P(e_i \mid s'')$$

under the condition $H\tilde{e}^T = s''$. This can be achieved by means of a "syndrome-based iterative (or message passing) decoder" [12].

Finally, as soon as $\tilde{e}$ is determined, it is possible to obtain the estimate of x which is designated as $\tilde{x}$, where $\tilde{x} = y + \tilde{e}$. The result of this decoder thus is an estimate of x, which is presently referred to as $\tilde{x}$. Rate-compatible variants of this method have been proposed in [13] and [14]. In this approach, the encoder first sends a syndrome s to the decoder. If the decoder is successful, the encoder takes no action. Otherwise, the encoder sends additional syndrome bits s'. The receiver unit then tries to decode using s and s'. If the decoding is still not successful, this process can be repeated several times.

Another possibility is the so-called "parity approach" (see e.g. [15]), which used turbo codes. This approach is based on a (n, k) systematic error correction code. In this approach, the distributed source encoder x is used as an input for the channel encoder. After application of a suitable permutation, the output can be described as c=(x, p), where p is an n-k vector referred to as parity. The distributed source encoder then sends only the parity bits to the decoder, i.e. the vector p. The decoder then forms a vector ć=(y, p) which is then transmitted to the channel encoder as an input. It should be noted that the two parts of ć have different reliabilities. While y is interpreted as a noisy version of x, the parity p is a perfect (noise-free) observation. Finally, the channel decoder yields an estimate for x, $\tilde{x}$, at its output. The parity approach can also be modified in order to use a systematic rateless code, i.e. an LT- or Raptor Code, see [16] and [17]. This means that additional parity bits can be generated and sent to the decoder if necessary, if the same was unable to decode in a similar manner as in the rate-compatible parity approach.

These two approaches, the syndrome and the parity approach, are not general approaches, because they are tailored to particular channel code families. Other related approaches exist. For example, [18] used a general approach that allows to basically use any channel code, while [19] presented an approach based on the channel polarization.

SUMMARY OF THE INVENTION

According to some embodiments of the present invention, the invention may be characterized by the following features:

1. A transmitter unit and one or more receiver units.
2. The transmitter unit and the at least one receiver unit comprise local Bloom filters (or a variant thereof) which are similar to each other (but not necessarily identical).
3. The fact that the transmitter unit and the receiver unit only have direct access to their local Bloom filter (or a variant thereof) and not to the Bloom filter of the other parties. However, the parties involved can estimate the similarity of the Bloom filters, e.g., they can know that the Bloom filters differ in only about 1% of the bits. It should be noted here that the invention can also be used if the transmitter unit does not know how similar the Bloom filters are.
4. The use of Slepian-Wolf or distributed source encoding techniques to transmit the Bloom filter (or a variant thereof) of the transmitter unit to one or a plurality of receiver units. This means that the transmitter unit encodes its Bloom filter into a message which is sent to the receiver unit.
5. The receiver unit uses its local Bloom filter (or variants thereof) as side information in decoding (decompressing) the message received from the transmitter unit. At the end of the decompression process, the receiver unit obtains, if it is successful, the Bloom filter (or a variant thereof) sent by the transmitter unit.

A substantial advantage of the above described scheme is that the messages exchanged between the transmitter unit and the receiver unit are smaller than the Bloom filter transmitted in the message, i.e. the scheme compresses the Bloom filter (or a special variant thereof).

BRIEF DESCRIPTION OF THE DRAWINGS

FIG. 2 illustrates the syndrome approach for the distributed source encoding, while

DESCRIPTION OF THE INVENTION

Applications of the Slepian-Wolf Encoding

Figure 1:
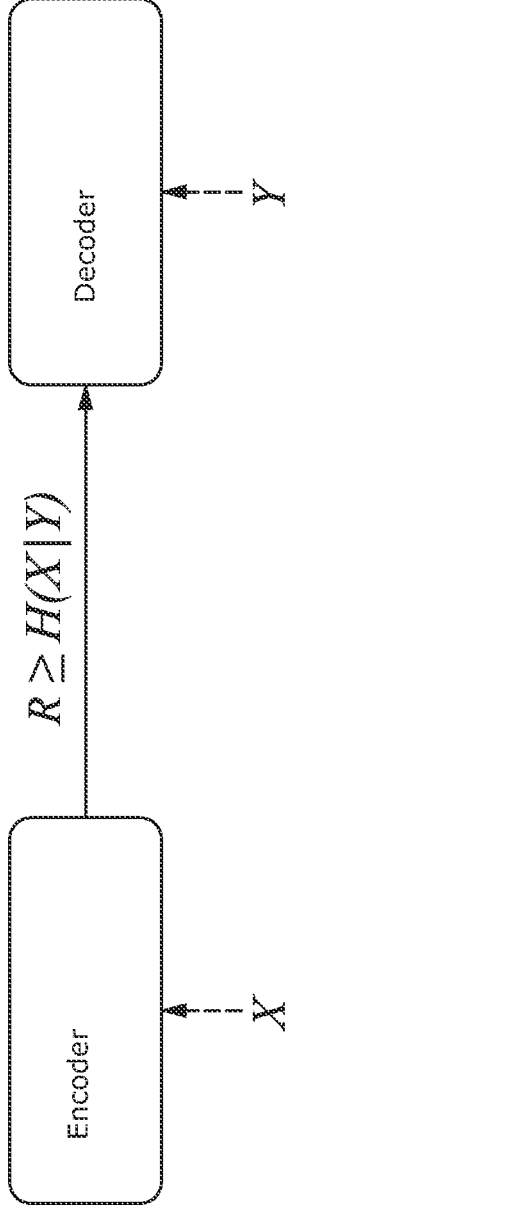
FIG. 1 illustrates the structure of the distributed source encoding. The encoder monitors the random variable X and the decoder monitors the random variable Y. The encoder compresses its message, while only having access to X, whereas the decoder performs the decompression, while only having access to Y and the (decompressed) message received from the encoder. A perfect (loss-free) compression is possible at a rate R which is equal to or higher than H(X|Y).
Figure 1:
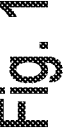
Figure 2:
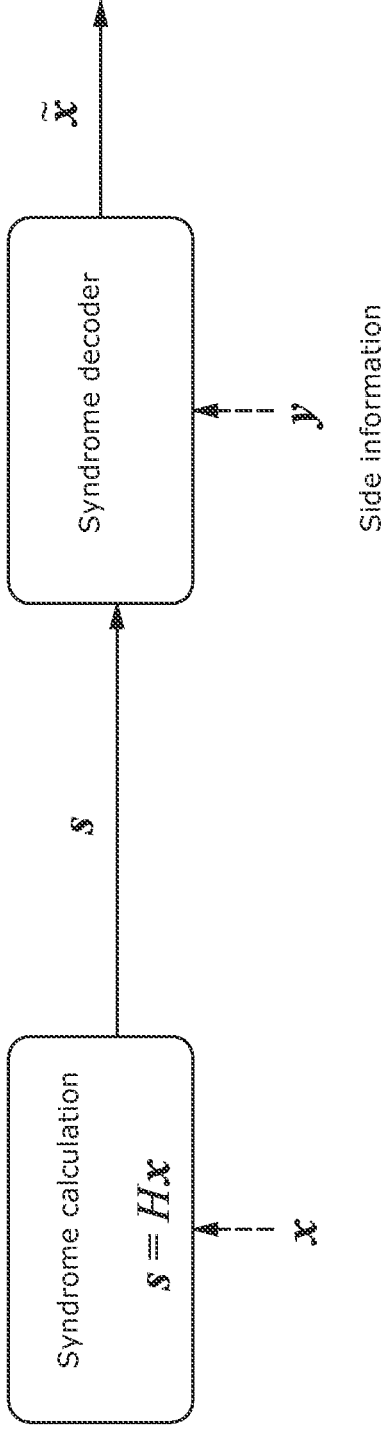
Figure 3:
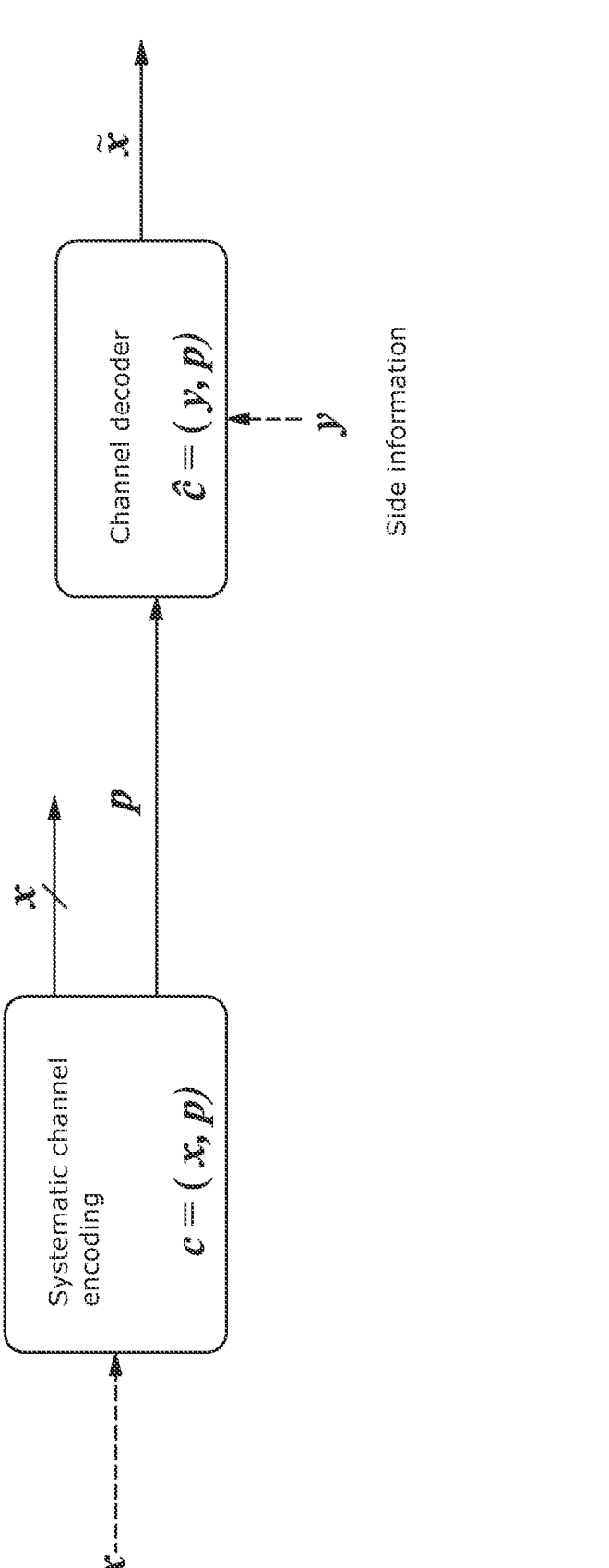
FIG. 3 illustrates the parity approach for the distributed source encoding.

In the present invention, it is proposed, as will be explained later, to use Slepian-Wolf encoding techniques to compress Bloom filters or variants thereof. [20] and [21] proposed a method for data set reconciliation. In this paper, two hosts, A and B, are in possession of two different data sets $S_A$ and $S_B$. The difference or the distance between $S_A$ and $S_B$ can be defined as:

$$d = |(S_A \cup S_B)\backslash(S_A \cap S_B)|$$

i.e. the number of elements present in $S_A$, but not in $S_B$, plus the number of element present in $S_B$, but not in $S_A$. In [20], it is assumed that d is limited upward by t, where t is known to the hosts A and B. The proposed method operates as follows. Host A creates a hash table $X_A$, into which $S_A$ is inserted. This hash table is an array of m bits that uses a hash function h(.) which yields a natural number between 0 and m−1 at the output. To insert $S_A$ into the hash table, h(s) is calculated for each elements in $S_A$ and the following is performed:
if h(s)=0, the h(s)-th bit of the hash table is set to one,
if h(s)=1 (hash collision), the next entry of the hash table (modulo m) is overturned.
Host B follows the same procedure to insert its data set $S_B$ into a hash table $X_B$. Host A can then employ the Slepian-Wolf encoding to compress $X_A$, and host B can decompress the message and obtain $X_A$ by using $X_B$ as side information.

Disadvantages of Related Art

Compressed Bloom filters according to [2] can allow to reduce the message size required for the transmission of a Bloom filter, but they are an example for standard source ending (compression) and not for distributed source encoding. Therefore, they cannot use side information. This means that in those cases in which a transmitter unit sends a Bloom filter to a receiver unit and the receiver unit holds side information (e.g. about a similar Bloom filter), these cannot be used and the method is thus suboptimal.

The delta encoding scheme according to [2] can be used by the transmitter unit to efficiently update a Bloom filter at a receiver node. It should be noted that this is limited to the case in which the transmitter unit exactly knows the Bloom filter it intends to update. This applies, for example, to Web Cache Sharing, where proxies exchange the list of URLs stored by them and each proxy keeps a list of the URLs stored by each other proxy. However, this is not the case in some other applications. In some cases, the transmitter unit does not wish to update a Bloom filter it knows exactly, but it intends to transmit a Bloom filter $BF_A$ to the receiver unit that is in possession of $BF_B$ which is similar to $BF_A$ (but not necessarily the same). In this application, delta compression cannot be applied. It should also be noted that, if reference is presently made to Bloom filters, this also applies to any other Bloom filter variant. Delta compression may be used to update any Bloom filter variant, if the filter to be updated is exactly known, but cannot be used to compress a filter such that it can be decompressed if the receiver unit has access to a similar (but not identical) filter.

The disadvantage of the scheme in [20, 21] is that the hash tables that are exchanged are similar to, but not identical with Bloom filters having a hash function. In particular, the hash tables are related to Bloom filters with a single hash function, but in the event of a hash collision, the hash table shows a different (and more complex) behavior compared to a Bloom filter. It should be considered that one of the major advantages of Bloom filters is their conceptual simplicity and their uncomplicated implementation.

Solution to the Problem

To remedy the above described disadvantages, the present invention proposes a method for transmitting a Bloom filter from a transmitter unit to a receiver unit, the method comprising the following steps:
providing a Bloom filter by the transmitter unit;
compressing the Bloom filter by the transmitter unit, the compression of the Bloom filter being performed based on a Slepian-Wolf encoding method; and
transmitting the Bloom filter compressed using the Slepian-Wolf encoding method from the transmitter unit to the receiver unit.

The Bloom filter (often also referred to as Bloom filter data structure) is thereby compressed in an efficient manner and is transmitted to the receiver unit in a compressed form. The required bandwidth is significantly reduced thereby. Thereafter, the Bloom filter is decompressed on the receiver side. This may come with a certain computational effort, which, however, is well acceptable for most applications.

According to the present invention, it may be provided that the compression of the Bloom filter is performed using a distributed source code at a fixed information rate, and in particular using a convolutional code, a turbo code, a Low Density Parity Check Code, or a polar code.

It may also be provided that
the compression of the Bloom filter is performed using a Low Density Parity Check Code;
the compression of the Bloom filter comprises the calculation of a syndrome according to $s=H x^T$, where H is the control matrix, x describes the Bloom filter, and (.)T is the transposed matrix; and
wherein the syndrome s is transmitted from the transmitting unit to the receiver unit.

Further, it may be provided in the method according to the present invention that the compression of the Bloom filter is performed using a rate-compatible source code.

Moreover, it may be provided in the method according to the present invention that the compression of the Bloom filter is performed using a Low Density Parity Check Code, wherein, first, a first syndrome s is transmitted from the transmitting unit to the receiver unit, and the transmitter unit transmits additional syndrome bits to the receiver unit, if the receiver unit is unable to reconstruct the Bloom filter of the transmitter unit using the present syndrome bits. Analogously, it may be provided that a request message is transmitted from the receiver unit to the transmitter unit, wherein the request message transmitted to the transmitter unit by the receiver unit may be configured to trigger transmission of the additional syndrome bits from the transmitter unit to the receiver unit. As an alternative, it may be provided that the transmission of additional syndrome bits is triggered by the lapse of a timer.

According to some embodiments of the method according to the present invention, it may additionally be provided that the transmission of additional syndrome bits from the transmitter unit to the receiver unit is repeated until the receiver unit is able to reconstruct the Bloom filter of the transmitter unit.

Furthermore, it may be provided in the method according to the invention that the encoding is based on an information rateless encoding, and that the transmitter unit continuously sends redundancy information to the receiver unit, and does so preferably until the receiver unit is able to reconstruct the Bloom filter of the transmitter unit.

Moreover, according to preferred embodiments of the method according to the present invention, it may be provided that the transmitter unit repeatedly sends parity information to the receiver unit, until the receiver unit is able to reconstruct the Bloom filter of the transmitter unit.

Further, it may preferably be provided that the Bloom filter according to the present invention is designed as a counting Bloom filter, an Invertible Bloom Lookup Table, IBLT, a multi-level Bloom filter or a d-left counting Bloom filter.

In addition, to solve the above described object, a method for reconstructing a Bloom filter by a receiver unit is proposed, the method comprising the following steps:

receiving, by a receiver unit, a compressed Bloom filter sent by a transmitter unit, the compressed Bloom filter being compressed based on a Slepian-Wolf encoding method;

decompressing the compressed Bloom filter using a Slepian-Wolf decoding method.

In the decoding method according to the method of the invention, it may be provided that the decompression of the compressed Bloom filter is performed using a Low Density Parity Check Code decoding method.

In addition, it may be provided in the method according to the present invention that the decompression of the compressed Bloom filter is performed based on a syndrome decoding method and with the use of side information.

Moreover, to solve the object described above, a transmitter unit comprising a processor unit, a memory unit and a communication unit, is proposed, the transmitter unit being configured to provide a Bloom filter;

compress the Bloom filter, the compression of the Bloom filter being performed based on a Slepian-Wolf encoding method; and transmit the Bloom filter compressed using the Slepian-Wolf encoding method to a receiver unit.

Moreover, to solve the object described above, a receiver unit comprising a processor unit, a memory unit and a communication unit, is proposed, the receiver unit being configured to receive a compressed Bloom filter sent by a transmitter unit, the compressed Bloom filter being compressed based on a Slepian-Wolf encoding method;

decompress the compressed Bloom filter using a Slepian-Wolf decoding method.

The present invention consists in the use of distributed source encoding (also known as the Slepian-Wolf encoding method) to compress Bloom filters or variants thereof. In this manner, Bloom filters can be compressed in many scenarios in which the use of a delta encoding according to the related art is not possible.

Figure 4:
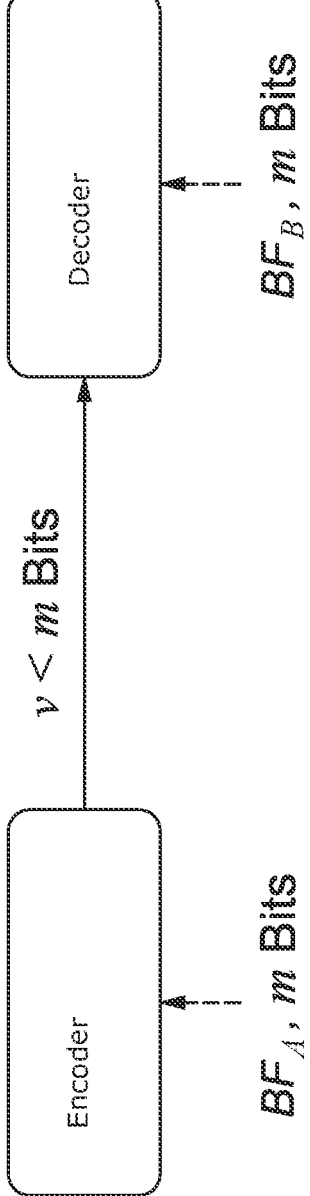
FIG. 4 illustrates the application of the distributed source encoder to the Bloom filter. The encoder monitors the Bloom filter $BF_A$ and the decoder monitors $BF_B$, both filters being m bits in length. The encoder compresses $BF_A$ in a message with v<m bits which is sent to the decoder. The decoder performs decompression, while it only has access to $BF_B$ and the (compressed) message received from the encoder.

The simplest case in which the present invention can be implemented will be described hereunder. Host A (the transmitter unit or the encoder) is in possession of a Bloom filter $BF_A$ and Host B (the receiver unit or the decoder) includes the Bloom filter $BF_B$. It shall be assumed that both Bloom filters $BF_A$ and $BF_B$ have a length of m bits. The transmitter unit intends to send $BF_A$ to host B, and the objective is to do this efficiently, i.e. to transmit as few bits as possible (see FIG. 4). A compression is only possible, if the conditional entropy of $BF_A$ is small, with $BF_B$ given, which is the case, for example, if the filters are similar, i.e. differ in few positions.

Hereinafter, three different cases will be considered in dependence on the assumptions about the similarity between $BF_A$ and $BF_B$.

Case 1

This case is relevant in particular if host A knows that the two filters differ at most in t bits of a total of m bits. Therefore, host A can rely on a distributed source encoding scheme with a fixed rate, which can be achieved with a code with a fixed rate, e.g. a convolutional code, a turbo code, an LDPC code or a polar code.

Basically, any distributed source encoding scheme can be implemented, including the methods described above as syndrome- and parity-based, or also the general scheme according to [18]. The present invention will be illustrated with reference to a syndrome-based method based on an LDPC code. In this case, a binary code with a size (m, k) is used, the parity check matrix of which is designated as H, with m being the size of the Bloom filter. For the sake of simplicity, x designates the Bloom filter $BF_A$ in the following. The encoder can compress x by calculating the syndrome $s=H\,x^T$, where $(.)^T$ is the transposition operator. The syndrome s having a length of m–k bits is sent to the decoder. The decoder can then use syndrome decoding to recover $BF_A$, using $BF_B$ as side information or secondary information and the received syndrome s, as shown e.g. in [12].

Case 2

This case is relevant in particular if host A knows that $BF_A$ and $BF_B$ differ in approximately d positions or bits. In this case, host A can implement a method similar to case 1, but rely on a rate-compatible code. That means that host A first calculates a syndrome s and sends it to host B, which syndrome is probably long enough to allow host B the reconstruction of $BF_A$. If host B is unable to decode, i.e. to reconstruct $BF_A$, host A can send additional syndrome bits. These additional syndrome bits can be combined with the first syndrome transmitted, and host B can again attempt decoding. If necessary, this process can be repeated many times, as shown in [14], for example.

Case 3

This case is relevant in particular if host A is not sure how great the conditional entropy between $BF_A$ and $BF_B$ is, i.e. how similar the filters are. In this case, the method is based on a rateless distributed encoding method. Host A thus continuously sends redundance to host B, and host B attempts to continuously decode. If host B is successful, it notifies host A which then stops transmitting the redundance. Here, one may rely on the methods introduced in [16] and [17]. These methods can basically generate an infinite number of parity symbols.

Extension to Other Types of Bloom Filters

Up to this point, only the application of the distributed source encoding to standard Bloom filters has been discussed. However, it is also possible to apply the above described principle to any Bloom filter variant. A Bloom filter variant can generally be represented as one or more arrays of cells, each cell being a data structure. In a standard Bloom filter, for example, there is one array of bits, in a counting Bloom filter each cell corresponds to a counter, and in the case of IBLTs, a cell is a data structure with three different fields; a counter field, a keySum field and a valueSum field.

In this case it still applies that a loss-free compression at rates of R≥H(X|Y) is possible, but the random variables X and Y associated to the Bloom filter variants $BF_A$ and $BF_B$, do no longer assume values in a binary alphabet, but in a non-binary alphabet with a larger cardinality.

The implementation of the present invention will now be illustrated with reference to counting Bloom filters. It shall be assumed that each counter is t bits in length. In this case, X and Y take values from the alphabet $A=\{1, 2, \ldots, 2^t\}$. In this case, it is useful to use a non-binary code in the distributed source encoding. In particular a code built on a finite field $2^l$ elements, $F_{2^l}$. For example, a (m, k) LDPC can be used which is based on $F_{2^l}$ and is described by its (non-binary) parity check matrix H. Thus, like in the binary case, the syndrome is calculated as follows $$s = Hx^T$$

However, the syndrome now is a vector of the length m−k with elements in $F_{2^l}$. This syndrome is now sent to the host B which performs the decoding of the syndrome in a manner similar to that described for the binary case, using its local counting Bloom filter $BF_B$ as side information.

As an alternative, a binary code can also be used. In this case, the counting Bloom filter $BF_A$ can be simply interpreted as a binary array $x_b$ with a length of m·ℓ bits, where m is the number of cells (counters) and t is the number of bits per cell (counter). Now, a binary code can be used to compress $x_b$. If one relies on the syndrome approach, a binary code (m·ℓ, k·ℓ) with a parity check matrix H can be used. Host A can now calculate a (binary) syndrome $s_b=H x_b^T$ and transmit the same to host B which then performs a (binary) syndrome decoding based on $s_b$ and $y_b$, which is the binary representation of the counting Bloom filter $BF_B$.

Another embodiment shows how the invention can be applied to IBLTs. In this case, each cell has three fields (counter, keySum and valueSum), the respective length (in bits) of which is designated by t, ξ and γ. In this case, one could rely on different code constructions to build the distributed source encoding scheme. A first possibility would be the use of a binary code of the length m(ℓ+ξ+γ) with a parity check matrix H. In this case, the IBLT of host A can be interpreted as a binary vector $x_b$ of the length m(ℓ+ξ+γ) and a binary syndrome vector $s_b$ is obtained by multiplication of the (binary) parity check matrix H by $x_b$, $s_b=H x_b^T$. Host B would then interpret its IBLT as a binary vector $y_b$ used as side information in the syndrome decoding. As an alternative, one could rely on three different channel codes built via $F_{2^l}$, $F_{2^\xi}$ and $F_{2^\gamma}$ and used to calculate three different non-binary syndrome vectors connected with the field count, keySum and valueSum, respectively. These three syndromes are then sent to host B which performs the decoding of the syndromes. Finally, it would be possible to use a code via $F_{2^{\ell+\xi+\gamma}}$ to calculate a single non-binary syndrome vector and to perform a non-binary syndrome decoding. Similar approaches can be used for other Bloom filter variants.

Finally, it has to be noted that in the above the application of the invention to Bloom filter variants was illustrated based on the syndrome approach, but that the present invention can also be used analogously with the parity approach or the general approach according to [18].

Applications of the Present Invention

Data Set Reconciliation

A possible application for data set reconciliation will be considered in the following. Hosts A and B respectively comprise a data set $S_A$ and $S_B$. It shall be assumed that both quantities include $10^5$ elements, $|S_A|=|S_B|=10^5$, and that the data set elements are 128 bits in length. Furthermore, it shall be assumed that the two data sets differ in only δ% of the elements. For the sake of simplicity, it shall be assumed that δ/2% of the elements of $S_A$ miss in $S_B$, and that δ/2% of the elements of $S_B$ miss in $S_A$. Finally, it shall be assumed that δ% are known to the host A.

For the sake of simplicity, only the first half of the data set reconciliation will be discussed, i.e. only that part will be discussed, in which the host A sends $BF_A$ to host B which then performs a membership query for all elements of $S_B$ and sends those elements that are negative to host A.

The desired false-positive probability is $10^{-8}$, which means that if $|S_A|=10^5$ membership queries are performed, the expected number of false positives is 0.001, so that they rarely occur. The smallest Bloom filter that can guarantee this false-positive probability, uses m=3834318 bits und k=27 hash functions. Such a filter has a size of 3.66 MB, and the communication effort is identical with the size of the filter, i.e. 3.66 MB of data have to be transmitted. Using the invention presented in this document, the amount of data to be transmitted can be drastically reduced.

Figure 5:
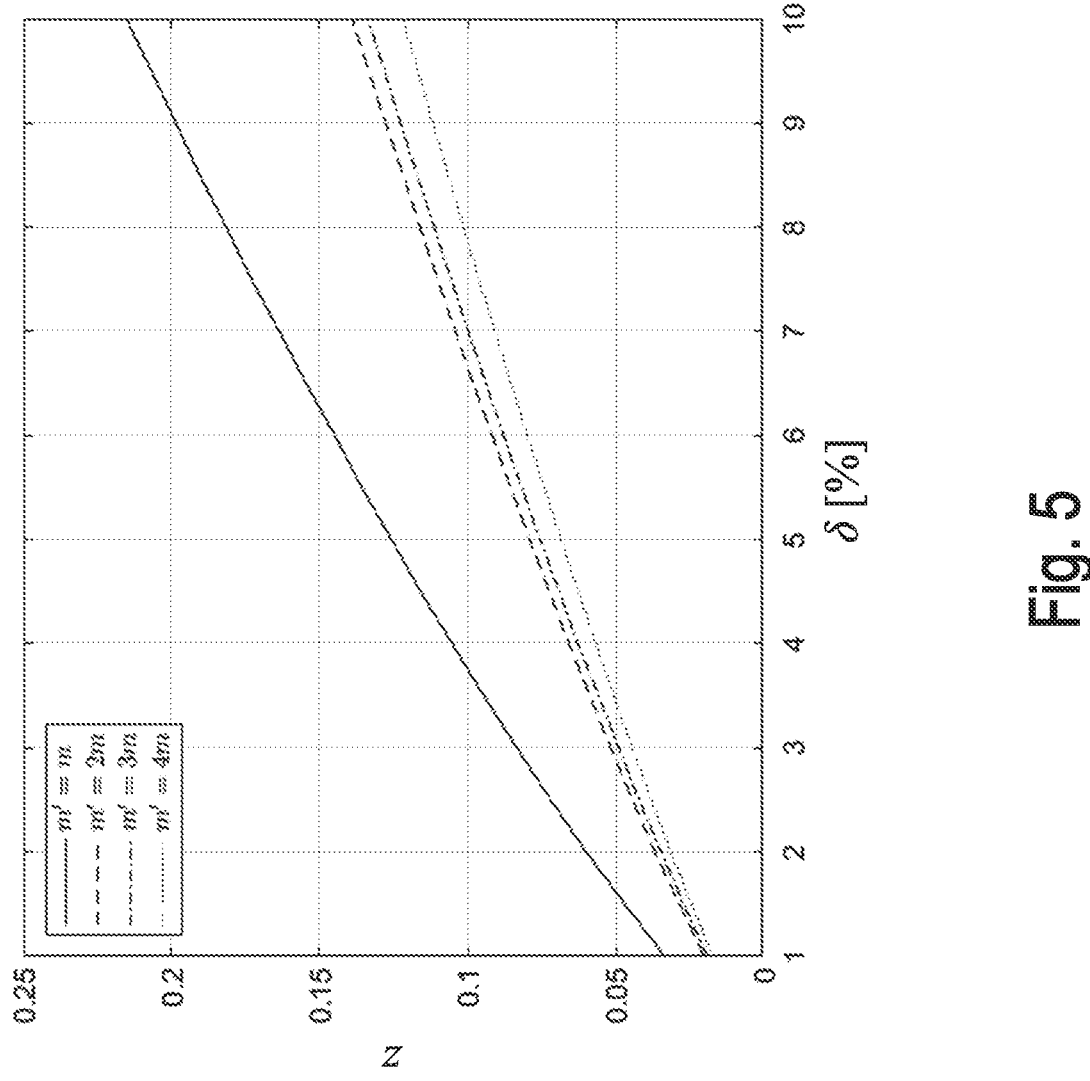
In FIG. 5, the standardized communication effort for the transmission of a Bloom filter with a false alarm probability of $10^{-8}$ using distributed source encoding. Here, the different graphs represent different filter lengths.

Furthermore, z shall designate the costs for the transmission of the Bloom filter with distributed source encoding, standardized to the Bloom filter size, if no distributed source encoding is used. The solid (upper) graph in FIG. 5 shows the dependence of z on δ. As can be seen, the communication effort can be drastically reduced by distributed source encoding, in particular if δ is small. For δ=1%, z~0.0335, for example, which means that the communication costs become about 30 times lower. This compression gain can be further increased by the use of a larger Bloom filter. In particular, the same false-positive probability can be retained by increasing the length of the Bloom filter to m'>m and reducing the number of hash functions to k'<k at the same time. FIG. 5 shows z considering filter sizes of 2m, 3m and 4m. As can be seen in FIG. 5, the selection of m'=2m already causes a significant reduction of z. For δ=1%, z~0.02, i.e. about 50 times less bandwidth is required to transmit the Bloom filter. It should be noted here that this means that the filter requires more storage space in the uncompressed state. As can be expected, the compression gain of the distributed source encoding becomes smaller, when δ increases. But even for δ=10%, the gain is still significant, as can be seen in FIG. 5.

Figure 6:
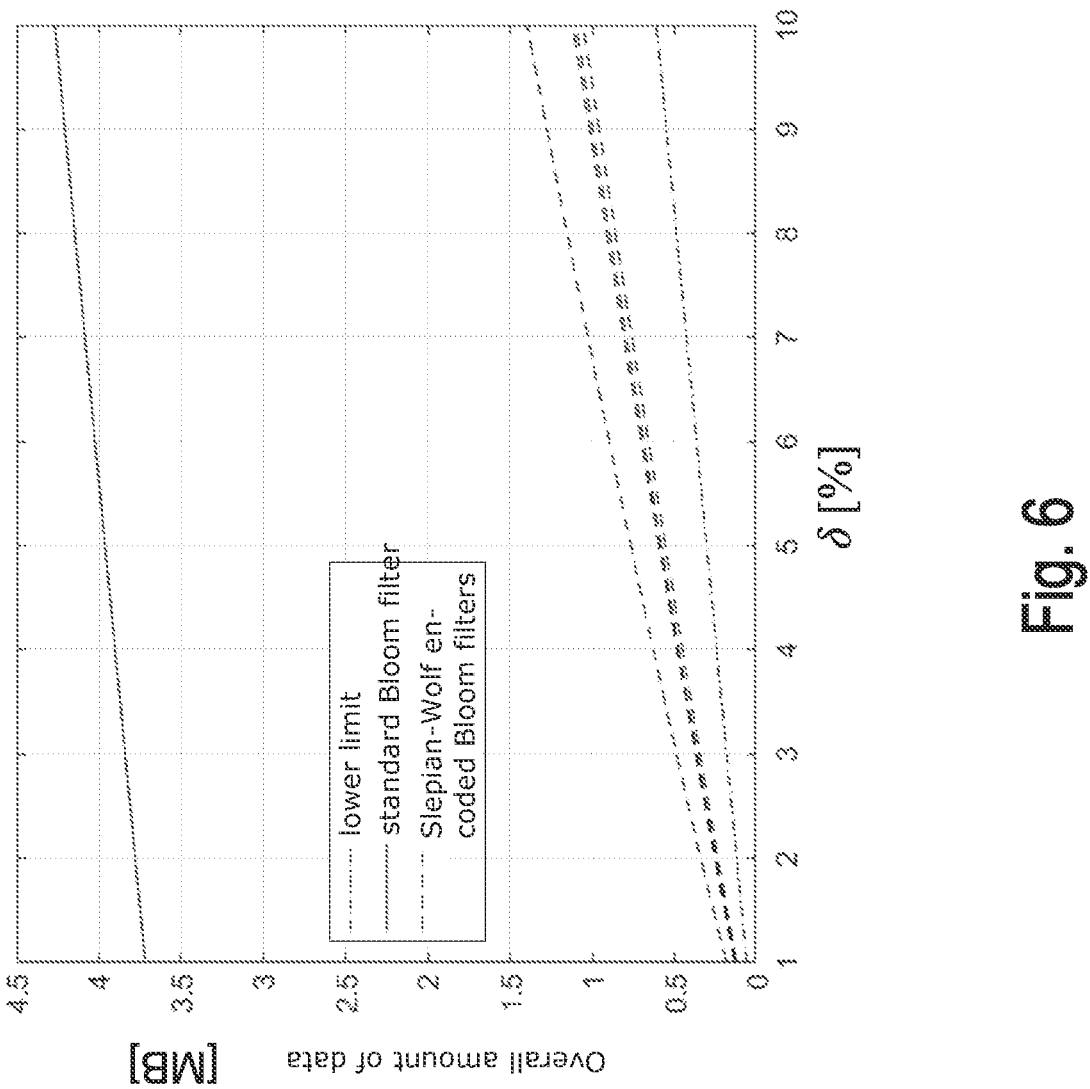
FIG. 6 illustrates the required total bandwidth for the first half of the data set reconciliation process. The lower chain-dotted line (lower limit) represents the communication effort required to transmit the elements of $S_B$ that are not included in $S_A$. The solid line (upper limit) represents the standard method without distributed source encoding, and the broken lines illustrate the bandwidth of the method with distributed source encoding for different Bloom filter lengths m', in particular m'=m, 2m, 3m and 4m.
Figure 7:
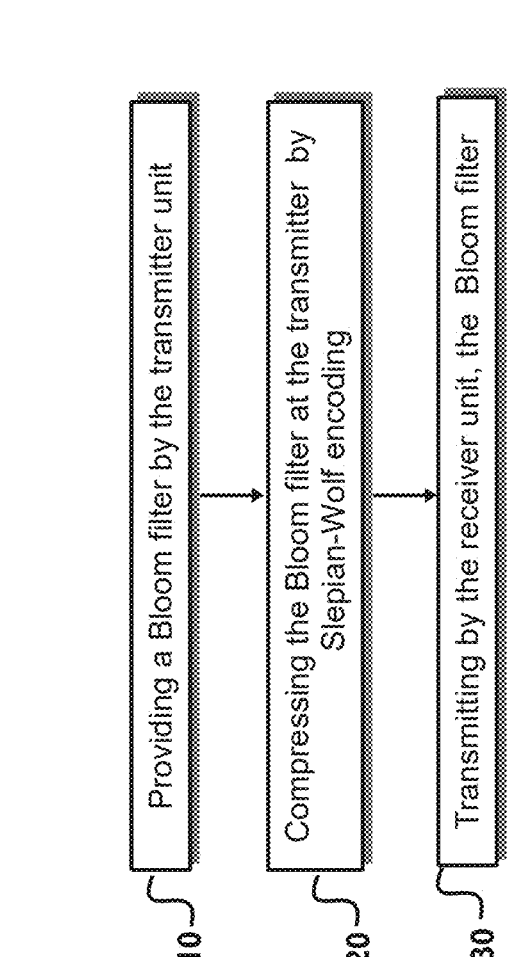
FIG. 7 shows an embodiment of the method 100 according to the invention. Here, in a first method step 110, a Bloom filter is provided by the transmitter unit. In a second method step 120, the Bloom filter is compressed on the transmitter side, the compression of the Bloom filter being performed based on a Slepian-Wolf encoding method. In a third method step 130, the compressed Bloom filter, compressed by means of the Slepian-Wolf encoding method, is transmitted to the receiver unit by the transmitter unit. Preferably, the compression can be made using a Low Density Parity Check Code, wherein, in preferred embodiments of the method according to the invention, a syndrome $s=H x^T$ is calculated (H refers to the control matrix, x refers to the Bloom filter, and $(.)^T$ refers to the transposed matrix) and the syndrome s is transmitted to the receiver unit by the transmitter unit.
Figure 8:
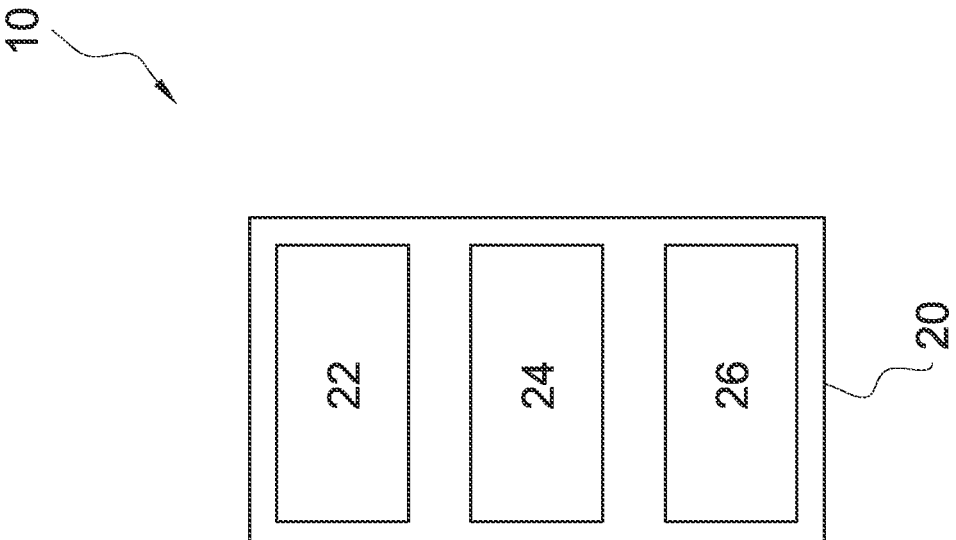
FIG. 8 illustrates an embodiment of a system 10 according to the invention, comprising a transmitter unit 12 and a receiver unit 20. The transmitter unit comprises a processor unit 14, a memory unit 16 and a communication unit 18. The receiver unit 20 also comprises a processor 22, a memory unit 24 and a communication unit 26. The transmitter 12 and the communication unit 20 are configured to execute the method steps described in the context of the method of the present invention.
Figure 8:
Figure 8:
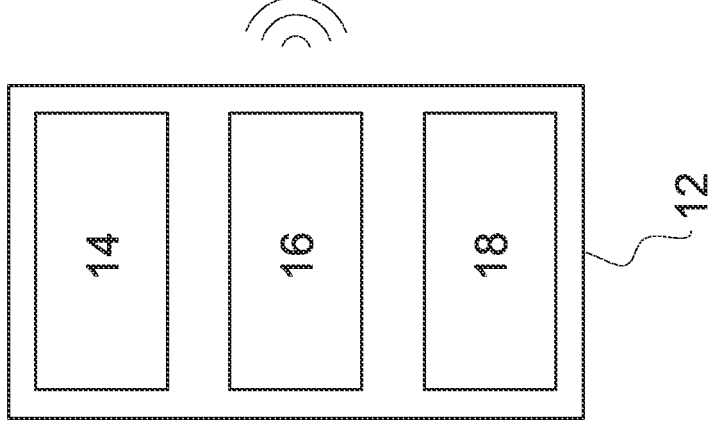

Moreover, FIG. 6 illustrates the communication effort (or the bandwidth) in MB of the first half of the data set reconciliation process (the transmission of the Bloom filter and the missing data set elements) in dependence on the difference in quantity δ. As can be seen in FIG. 6, the present invention allows for a drastic reduction in communication effort. For small values of δ, the entire communication effort approaches the minimum, i.e. the effort for the transmission of only those elements in $S_B$ that miss in $S_A$.

Detection of Malicious URLs

Next, a decentralized service for detecting malicious URLs will be considered, which involves a plurality of servers. Each server can operate independently and keep a database with malicious URLs, wherein the servers can cooperate to synchronize their data bases. In any case, it has to be assumed that the data bases of the different servers differ slightly, since the servers may apply different standards to determine a malicious URL. For example, the servers may be located in different countries, so that the legal framework may be different.

Users can regularly contact a server to download a Bloom filter which approximately represents the data base with malicious URLs. If a user always downloads the Bloom filter from the same server, it is possible to rely on delta encoding in order to reduce the communication effort, i.e. the bandwidth required to update the Bloom filter. However, in some cases it may happen that users contact different servers to download the Bloom filter. This could be a design decision, for example, to balance the load on the different servers, or could occur in the case that the desired server is not available due to overload or hardware/network failure. In this case, it is not possible to apply delta encoding, since the new server (transmitter unit) does not exactly know the Bloom filter of the user (receiver unit) downloaded from another (old) server. By means of the present invention, however, it is possible to compress the Bloom filter on the basis of Slepian-Wolf encoding. For example, it shall be assumed that the data bases with malicious URLs comprise $10^5$ entries and that the Bloom filters are designed such that they offer a false-positive probability of $10^{-8}$, while the Bloom filter length m is minimized. This results in a Bloom filter with m=3834318 bits and k=27 hash functions. The solid graph in FIG. 5 illustrates the compression that can be achieved in dependence on δ, the percentage of entries by which the data bases of the old and the new server differ. If, for example, 5% of the entries differ (which may well be considered the worst case), the Bloom filter can be compressed to about 12.5% of its original size, i.e. the compressed Slepian-Wolf message transmitting the Bloom filter is about eight times smaller than the Bloom filter. Similar to data set reconciliation, larger compression gains can be achieved at the expense of the use of larger Bloom filters (with a smaller number of hash functions). In this case too, it applies: If the difference between the two databases with malicious URLs on the old and the new server is not surely known, a rate-compatible or rateless code may be used.

Fields of Application of the Present Invention

The present invention can be implemented in each network application, in which Bloom filter or variants thereof are sent as messages, provided that the receiver unit has access to some side information (e.g. a similar Bloom filter). This includes the following applications, but is not limited to these:
  data bases
  distributed storage
  distributed caching
  peer-to-peer networks (P2P)
  data set reconciliation
  routing
  monitoring and measuring data flows in routers

LIST OF ABBREVIATIONS

IBLT invertible Bloom lookup table
LDPC low-density parity-check

LIST OF REFERENCE NUMERALS 10 system
12 transmitter unit
14 processor unit of the transmitter unit
16 memory unit of the transmitter unit
18 communication unit of the transmitter unit
20 receiver unit
22 processor unit of the receiver unit
24 memory unit of the receiver unit
26 communication unit of the receiver unit
100 method
110 first method step
120 second method step
130 third method step

LIST OF REFERENCES

[1] B. Bloom, "Space/time trade-offs in hash coding with allowable errors", *Communications of the ACM*, vol. 13, no. 7, pp. 422-426, 1970.
[2] M. Mitzenmacher, "Compressed bloom filters", *IEEE/ACM transactions on networking*, vol. 10, no. 5, pp. 604-612, 2002.
[3] L. Fan, P. Cao, J. Almeida, and A. Z. Broder, "Summary cache: a scalable wide-area web cache sharing protocol", *IEEE/ACM transactions on networking*, vol. 8, no. 3, pp. 281-293, 2000.
[4] S. Tarkoma, C. E. Rothenberg, and E. Lagerspetz, "Theory and practice of bloom filters for distributed systems", *IEEE Communications Surveys & Tutorials*, vol. 14, no. 1, pp. 131-155, 2011.
[5] M. Goodrich and M. Mitzenmacher, "Invertible Bloom lookup tables", in 2011 *49th Annual Allerton Conference on Communication, Control, and Computing (Allerton)*. Monticello, IL, USA: IEEE, 2011, pp. 792-799.
[6] J. Byers, J. Considine, M. Mitzenmacher, and S. Rost, "Informed content delivery across adaptive overlay networks", *ACM SIGCOMM Computer Communication Review*, vol. 32, no. 4, pp. 47-60, 2002.
[7] M. Skjegstad and T. Maseng, "Low complexity set reconciliation using bloom filters", in *Proceedings of the 7th ACM ACM SIGACT/SIGMOBILE International Workshop on Foundations of Mobile Computing*, 2011, pp. 33-41.
[8] D. Guo and M. Li, "Set reconciliation via counting bloom filters", *IEEE Transactions on Knowledge and Data Engineering*, vol. 25, no. 10, pp. 2367-2380, 2012.
[9] D. Eppstein, M. Goodrich, F. Uyeda, and G. Varghese, "What's the difference?: Efficient set reconciliation without prior context", *ACM SIGCOMM Comp. Commun. Review*, vol. 41, no. 4, pp. 218-229, 2011.
[10] Y.-H. Feng, N.-F. Huang, and C.-H. Chen, "An Efficient Caching Mechanism for Network-Based URL Filtering by Multi-Level Counting Bloom Filters", in *Proc. of 2011 IEEE Intern. Conf. on Commun. (ICC)*, Kyoto, Japan.
[11] D. Slepian and J. Wolf, "Noiseless coding of correlated information sources", *IEEE Trans. Inf. Theory*, vol. 19, no. 4, pp. 471-480, 1973.

[12] A. D. Liveris, Z. Xiong, and C. N. Georghiades, "Compression of binary sources with side information at the decoder using ldpc codes", *IEEE communications letters*, vol. 6, no. 10, pp. 440-442, 2002.

[13] A. W. Eckford and W. Yu, "Rateless slepian-wolf codes", in *Proc. Asilomar conference on signals, systems and computers,* 2005, pp. 1757-1761.

[14] D. Varodayan, A. Aaron, and B. Girod, "Rate-adaptive codes for distributed source coding", *Signal processing*, vol. 86, no. 11, pp. 3123-3130, 2006.

[15] J. Garcia-Frias, "Compression of correlated binary sources using turbo codes", *IEEE Communications letters*, vol. 5, no. 10, pp. 417-419, 2001.

[16] D. Sejdinovic, R. J. Piechocki, and A. Doufexi, "Rateless distributed source code design", in *Proceedings of the 5th International ICST Mobile Multimedia Communications Conference,* 2009, pp. 1-7.

[17] M. Fresia and L. Vandendorpe, "Distributed source coding using raptor codes", in *IEEE GLOBECOM 2007- IEEE Global Telecommunications Conference.* IEEE, 2007, pp. 1587-1591.

[18] P. Tan and J. L. Tiffany, "A general and optimal framework to achieve the entire rate region for slepian-wolf coding", *Signal Processing*, vol. 86, no. 11, pp. 3102-3114, 2006.

[19] E. Arikan, "Polar coding for the slepian-wolf problem based on monotone chain rules", in 2012 *IEEE International Symposium on Information Theory Proceedings.* IEEE, 2012, pp. 566-570.

[20] C. Westphal, "Synchronizing state with strong similarity between local and remote systems", in *Proceedings of the third ACM workshop on Mobile cloud computing and services,* 2012, pp. 15-20.

[21] C. Westphal, Futurewei Technologies, "U.S. Pat. No. 9,298,669 B2, systems and methods for synchronizing content tables between routers," March 2016.

The invention claimed is:

1. A method for synchronizing sets of data with a Bloom filter between a transmitter unit and a receiver unit, the method comprising the following steps:

generating, by the transmitter unit, a Bloom filter representing a first set of data items stored at the transmitter unit, the Bloom filter comprising a bit array of length m and generated using at least two independent hash functions;

compressing, by the transmitter unit, the Bloom filter using a distributed source coding technique based on Slepian-Wolf encoding to generate a syndrome; and transmitting, by the transmitter unit, the syndrome to the receiver unit;

reconstructing, by the receiver unit, an approximation of the Bloom filter using the received syndrome and a locally generated Bloom filter constructed by the receiver unit from a second set of data items; and determining, by the receiver unit, differences between the first set of data items and the second set of data items based on the reconstructed Bloom filter.

2. The method according to claim 1, wherein the compression of the Bloom filter is performed using a distributed source code at a fixed information rate, and in particular using a convolutional code, a turbo code, a Low Density Parity Check Code, or a polar code.

3. The method according to claim 2, wherein the compression of the Bloom filter is performed using a Low Density Parity Check Code, LDPC;

the compression of the Bloom filter comprises the calculation of a syndrome according to s=H $x^T$, where H is the control matrix, x describes the Bloom filter, and $^T$ is the transposed matrix; and the syndrome s being transmitted from the transmitting unit to the receiver unit.

4. The method according to claim 1, wherein the compression of the Bloom filter is performed using a rate-compatible source code.

5. The method according to claim 4, wherein the compression of the Bloom filter is performed using a Low Density Parity Check Code, wherein, first, a first syndrome s is transmitted from the transmitting unit to the receiver unit, and the transmitter unit transmits additional syndrome bits to the receiver unit, if the receiver unit is unable to reconstruct the Bloom filter of the transmitter unit using the present syndrome bits.

6. The method according to claim 5, wherein the transmission of additional syndrome bits from the transmitter unit to the receiver unit is repeated until the receiver unit is able to reconstruct the Bloom filter of the transmitter unit.

7. The method according to claim 1, wherein the encoding is based on rateless encoding, and the transmitter unit continuously sends redundancy information to the receiver unit, and does so preferably until the receiver unit is able to reconstruct the Bloom filter of the transmitter unit.

8. The method according to claim 7, wherein the transmission of additional syndrome bits from the transmitter unit to the receiver unit is repeated until the receiver unit is able to reconstruct the Bloom filter of the transmitter unit.

9. The method according to claim 1, wherein the Bloom filter is configured as a counting Bloom filter, an Invertible Bloom Lookup Table, IBLT, a multi-level Bloom filter or a d-left counting Bloom filter.

10. A method for reconstructing a Bloom filter by a receiver unit, the method comprising the following steps:

receiving, by a receiver unit, a syndrome generated by a transmitter unit from a Bloom filter representing a first set of data items, the Bloom filter compressed using a distributed source coding technique based on Slepian-Wolf encoding;

generating, by the receiver unit, a second Bloom filter representing a second set of data items, using at least two independent hash functions; and reconstructing, by the receiver unit, an approximation of the Bloom filter representing the first set of data items using the received syndrome and the second Bloom filter.

11. The method according to claim 10, wherein the compressed Bloom filter is decompressed using a Low Density Parity Check Code decoding method.

12. A transmitter unit comprising a processor unit, a memory unit and a communication unit, the transmitter unit being configured to:

generate a Bloom filter representing a first set of data items, the Bloom filter comprising a bit array of length m and constructed using at least two independent hash functions;

compress the Bloom filter, the compression of the Bloom filter using a distributed source coding technique based on Slepian-Wolf encoding to generate a syndrome;

transmit the syndrome to a receiver unit; and initiate a synchronization process with the receiver unit based on differences between the Bloom filter and a Bloom filter generated by the receiver unit from a second set of data items.

13. A receiver unit comprising a processor unit, a memory unit and a communication unit, the receiver unit being configured to:

receive a syndrome generated by a transmitter unit from a Bloom filter representing a first set of data items, the Bloom filter being compressed using a distributed source coding technique based on Slepian-Wolf encoding;

generate a second Bloom filter representing a second set of data items, using at least two independent hash functions; and reconstruct an approximation of the Bloom filter representing the first set of data items using the received syndrome and the second Bloom filter.

* * * * *